US009406855B2

(12) United States Patent
Noska (10) Patent No.: US 9,406,855 B2
(45) Date of Patent: Aug. 2, 2016

(54) LAMINATED ELECTRICAL TRACE WITHIN AN LED INTERCONNECT (71) Applicant: BRIDGELUX, INC., Livermore, CA (US)

(72) Inventor: Brandon Noska, Hallettsville, TX (US)

(73) Assignee: Xenio Corporation, San Francisco, CA (US)

( * ) Notice: Subject to any disclaimer, the term of this patent is extended or adjusted under 35 U.S.C. 154(b) by 22 days.

(21) Appl. No.: 14/213,071

(22) Filed: Mar. 14, 2014

(65) Prior Publication Data
US 2015/0263255 A1  Sep. 17, 2015

(51) Int. Cl.
*H01L 33/62* (2010.01)
*H05K 3/00* (2006.01)
*H01L 33/48* (2010.01)
*H05K 1/18* (2006.01)
*H05K 3/20* (2006.01)
*H05K 3/28* (2006.01)

(52) U.S. Cl.
CPC .............. *H01L 33/62* (2013.01); *H01L 33/483* (2013.01); *H05K 3/0014* (2013.01); *H05K 1/183* (2013.01); *H05K 3/202* (2013.01); *H05K 3/282* (2013.01); *H05K 2201/09036* (2013.01); *H05K 2201/09118* (2013.01)

(58) Field of Classification Search
CPC ..... H01L 25/0753; H01L 33/62; H01L 33/54; H01L 27/153
See application file for complete search history.

(56) References Cited

U.S. PATENT DOCUMENTS

2004/0189170 A1*  9/2004  Aisenbrey .................... 313/248

OTHER PUBLICATIONS

Product Information by Altek (2013). Retrived online on May 27, 2015 at http://www.altek-inc.com/news/2013-11/over-molding-vs-insert-molding-get-help-deciding-which-right-your-project.*

* cited by examiner

*Primary Examiner* — Jerome Jackson, Jr.
*Assistant Examiner* — Charles R Peters
(74) *Attorney, Agent, or Firm* — Arent Fox LLP

(57) ABSTRACT

Various apparatuses and methods are disclosed. An interconnect may include molding material configured to support a light-emitting device, and an electrical trace arranged with the molding material to electrically couple the light-emitting device to a power source, wherein the electrical trace has an electrical insulator on at least a portion thereof. A light-emitting apparatus may include a light-emitting device, molding material supporting the light-emitting device, and an electrical trace arranged with the molding material to electrically couple the light-emitting device to a power source, wherein the electrical trace has an electrical insulator on at least a portion thereof. A method of manufacturing may include providing an electrical trace having an electrical insulator on at least a portion thereof, and forming molding material capable of supporting a light-emitting device, wherein the molding material is formed with the electrical trace configured to electrically couple the light-emitting device to a power source.

6 Claims, 5 Drawing Sheets

LAMINATED ELECTRICAL TRACE WITHIN AN LED INTERCONNECT

BACKGROUND

1. Field

The present disclosure relates generally to a light-emitting device and, more particularly, to a laminated electrical trace within a light-emitting diode (LED) interconnect.

2. Background

A lighting system may include a light-emitting device that is supported by an interconnect. The interconnect may include an electrical trace that transfers power from a power source to the light-emitting device. The electrical trace may be substantially surrounded by molding material. The molding material may be formed around the electrical trace during an insert molding process. During the insert molding process, the electrical trace may be placed in a mold and supported by inserts that hold the electrical trace in the mold. The molding material may be injected into the mold. The molding material may substantially surround the electrical trace except for the portions of the electrical trace in contact with the inserts that hold up the electrical trace. After the molding material is injected into the mold, the inserts may be removed. No molding material may surround the portions of the electrical trace that were in contact with the insert during the insert molding process. As a result, such portions of the electrical trace may not be covered by the molding material and therefore may be exposed to air.

Such exposed portions of the electrical trace may cause problems. For example, such exposed portions of the electrical trace may corrode. As another example, such exposed portions of the electrical trace may be exposed to materials such as thermal grease or epoxy. As yet another example, the electrical trace may short-circuit at high voltages when such exposed portions of the electrical trace are nearby other metallic surfaces. Also, such exposed portions of the electrical trace may affect whether a product complies with certain safety standards (e.g., UL and/or CE). Accordingly, a need exists for improvements that overcome problems associated with such exposed portions of the electrical trace.

SUMMARY

Several aspects of the present invention will be described more fully hereinafter with reference to various apparatuses and methods.

One aspect of an interconnect is disclosed. An interconnect may include molding material configured to support a light-emitting device, and an electrical trace arranged with the molding material to electrically couple the light-emitting device to a power source, wherein the electrical trace has an electrical insulator on at least a portion thereof.

One aspect of a light-emitting apparatus is disclosed. A light-emitting apparatus may include a light-emitting device, molding material supporting the light-emitting device, and an electrical trace arranged with the molding material to electrically couple the light-emitting device to a power source, wherein the electrical trace has an electrical insulator on at least a portion thereof.

One aspect of a method of manufacturing an interconnect is disclosed. A method of manufacturing an interconnect may include providing an electrical trace having an electrical insulator on at least a portion thereof, and forming molding material capable of supporting a light-emitting device, wherein the molding material is formed with the electrical trace configured to electrically couple the light-emitting device to a power source.

It is understood that other aspects of apparatuses and methods will become readily apparent to those skilled in the art from the following detailed description, wherein various aspects of apparatuses and methods are shown and described by way of illustration. As understood by one of ordinary skill in the art, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatuses and methods will now be presented in the detailed description by way of example, and not by way of limitation, with reference to the accompanying drawings, wherein.

DETAILED DESCRIPTION

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus, method or article of manufacture does not require that all embodiments of the invention include the described components, structure, features, functionality, processes, advantages, benefits, or modes of operation._

The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus or method. Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, bulb shapes, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, molding material, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower", can therefore, encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

It will be further understood that the terms "comprises" and/or "comprising," when used in this specification, specify the presence of stated features, steps, operations, elements, and/or components, but do not preclude the presence or addition of one or more other features, integers, steps, operations, elements, components, and/or groups thereof. The term "and/or" includes any and all combinations of one or more of the associated listed items.

Unless otherwise defined, all terms (including technical and scientific terms) used herein have the same meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In the following detailed description, various aspects of the present invention will be presented in the context of an interconnect for a light-emitting device and method for making the same. However, those skilled in the art will realize that these aspects may be extended to other apparatus and methods and/or their features, steps, operations, elements, and/or components. Accordingly, any reference to an interconnect for a light-emitting device or method of manufacturing an interconnect for a light-emitting device is intended only to illustrate the various aspects of the present invention, with the understanding that such aspects may have a wide range of applications.

Figure 1A:
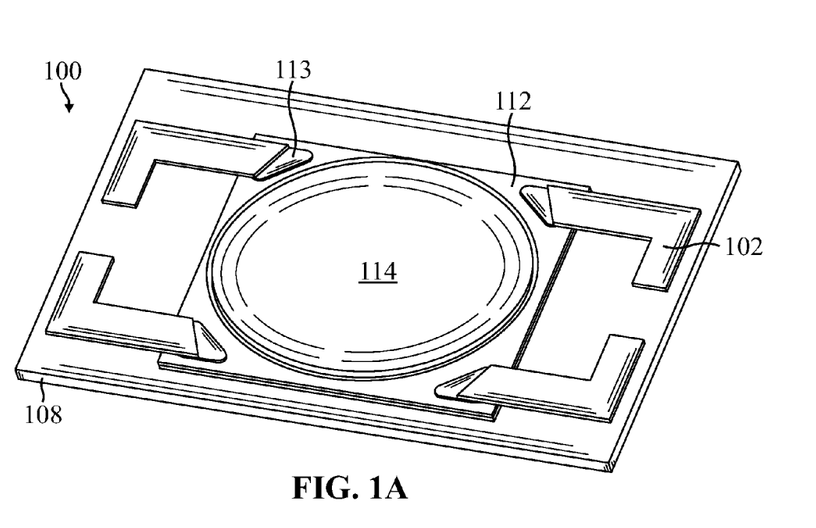
FIG. 1A is a top view illustration of a light-emitting apparatus.
Figure 1B:
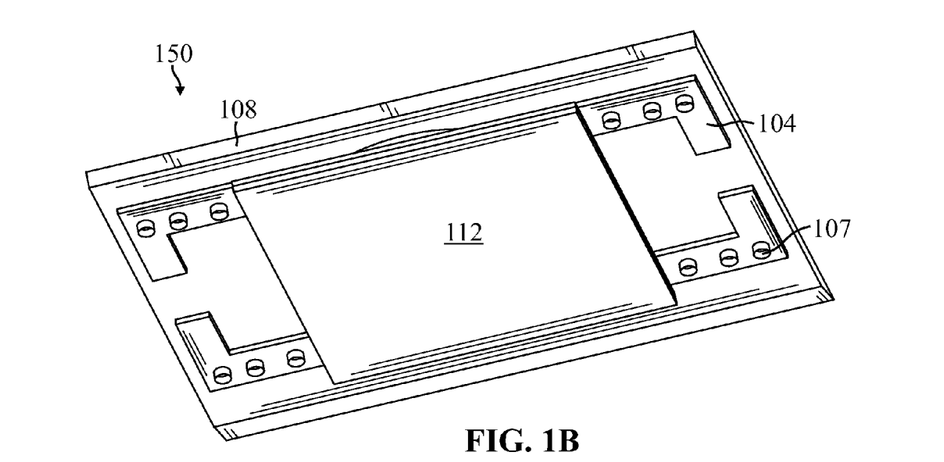
FIG. 1B is a bottom view illustration of the light-emitting apparatus of FIG. 1A.

FIG. 1A is a top view illustration 100 of a light-emitting apparatus. FIG. 1B is a bottom view illustration 150 of the same light-emitting apparatus. The light-emitting apparatus may include a light-emitting device 114, molding material 108 supporting the light-emitting device 114, and an electrical trace 102 arranged with the molding material 108 to electrically couple the light-emitting device 114 to a power source (not shown), wherein the electrical trace 102 has an electrical insulator 104 on at least a portion thereof. The light-emitting device 114 may be provided on the LED plate 112. Connectors 113 may connect the electrical trace 102 to the LED plate 112 and/or the light-emitting device 114. The connectors 113 and/or the LED plate 112 may transfer power from the electrical trace 102 to the light-emitting device 114. The molding material 108 may be configured to mechanically support the light-emitting device 114 with the light-emitting device 114 electrically coupled to the electrical trace 102. The electrical trace 102 may be provided on a top side of the light-emitting apparatus, and the electrical insulator 104 may be provided on a bottom side of the light-emitting apparatus. The electrical trace 102 and the electrical insulator 104 may be collectively surrounded by the molding material 108, except the portions of the electrical insulator 104 where inserts (e.g., inserts 106, 206, 306 in FIGS. 1, 2, 3) were previously positioned. Cavities 107 may be formed upon the removal of the inserts (e.g., inserts 106, 206, 306), as will be described in further detail infra.

The electrical insulator 104 prevents corrosion of at least the portions of the electrical trace 102 that would otherwise have been exposed to air. Also, the electrical insulator 104 prevents the electrical trace 102 from short-circuiting at high voltages when otherwise exposed portions of the electrical trace 102 are nearby other metallic surfaces (not shown). Additionally, the electrical insulator 104 obviates any need for a manufacturer or user to 'plug' (e.g., fill-in) the cavities 107 in order to prevent corrosions and/or short-circuiting.

Figure 2:
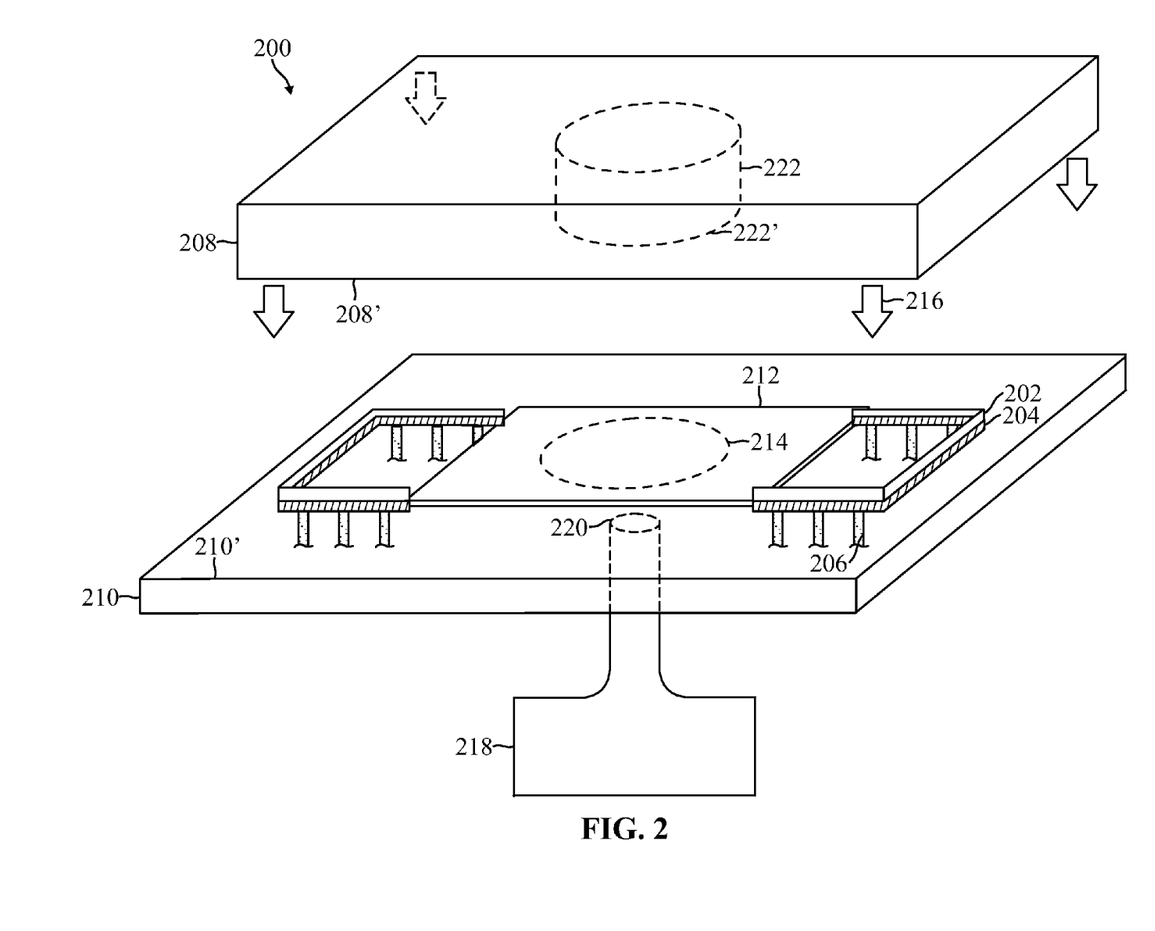
FIG. 2 is a side view illustration of an insert molding machine used for manufacturing an interconnect.

FIG. 2 is a side view illustration 200 of an insert molding machine used for manufacturing an interconnect. The insert molding machine may include a top plate 208 and a bottom plate 210. The bottom plate 210 may have one or more inserts 206. An electrical trace 202 having an electrical insulator 204 on at least a portion thereof may be provided on the inserts 206 of the bottom plate 210. The inserts 206 may hold up the electrical trace 202 and electrical insulator 204 above the bottom plate 210. In the example illustrated in FIG. 2, the electrical insulator 204 is provided between the electrical trace 202 and the inserts 206 of the bottom plate 210. After the electrical trace 202 and the electrical insulator 204 are provided on the inserts 206 of the bottom plate 210, the top plate 208 may be lowered 216 onto the bottom plate 210. Once the top plate 208 is lowered 216 onto the bottom plate 210, the bottom-side perimeter 208' of the top plate 208 may form a seal with the top-side perimeter 210' of the bottom plate 210. An injection component 218 may inject a semi-solid molding material into the cavity formed between the top plate 208 and the bottom plate 210 after the top plate 208 has been lowered onto the bottom plate 210. In the example illustrated in FIG. 2, the injection component 218 injects the semi-solid molding material through an opening 220 of the bottom plate 210. However, one of ordinary skill in the art will appreciate that the opening 220 may be provided at any portion(s) of the top plate 208 and/or bottom plate 210 without deviating from the scope of the present disclosure. After the semi-solid molding material is injected, the semi-solid molding material may harden (e.g., by cooling) to form a hardened molding material (e.g., molding material 308 in FIGS. 3A-3B and/or molding material 408 in FIGS. 4A-4B). Accordingly, the electrical trace 202 may be embedded inside of the molding material.

The molding material may include various materials. In some configurations, the molding material may include one or more polyimide films (e.g., Kapton, a type of polyimide film from Dupont). In some configurations, the molding material may include one or more perfluoroalkoxy (PFA) fluoropolymer films (e.g., Norton, a brand of film from Saint-Gobain). In some configurations, the molding material may include one or more fluorinated ethylene propylene (FEP) fluoropolymer films (e.g., Norton brand of film from Saint-Gobain). In some configurations, the molding material may include a material having a vinyl acetate resin on both sides of a polyester film (e.g., 3M EPE films). In some configurations, the molding material may include one or more polyester films with acrylic adhesive (e.g., 3M dielectric tapes). In some configurations, the molding material may include one or more polyester films. In some configurations, the molding material may include one or more metal oxide thin films (e.g., aluminum oxide). In some configurations, the molding material may include one or more ceramic thin films. In some configurations, the molding material may include spray coating (e.g., JARO 650 Series Polyimide). In some configurations, the molding material may include one or more amorphous aluminum phosphate films (e.g., Cerablak® UTF). In some configurations, the molding material may include an inorganic glass ceramic (e.g., Cerablak® HTP). In some configurations, the molding material may include an epoxy powder coating. One of ordinary skill in the art will appreciate that the foregoing configurations are provided for illustrative purposes and are not intended to limit the scope of the present disclosure. The molding material may include any combination of the foregoing examples without deviating from the scope of the present disclosure. Also, the molding material does not necessarily need to include any of the foregoing examples to be within the scope of the present disclosure.

In some configurations, the electrical trace 202 and/or electrical insulator 204 may be connected to an LED plate 212. The LED plate 212 may be configured to receive one or more LEDs (not shown) after the interconnect is manufactured. The LEDs may be provided onto the LED area 214 of the LED plate 212. The LED plate 212 may also be configured to transfer power from the electrical trace 202 to the one or more LEDs.

In some configurations, the top plate 208 may have a protruding portion 222. Generally, the protruding portion 222 may be configured to prevent the semi-solid molding material (injected into the cavity formed between the top plate 208 and the bottom plate 210) from forming on the LED area 214 of the LED plate 212. After the interconnect is manufactured, one or more LEDs may be provided in the LED area 214 of the LED plate 212. (For example, referring back to FIG. 1, light-emitting device 114 may be provided on the LED plate 112.)

The protruding portion 222 may be located in a region of the top plate 208 such that the bottom-side 222' of the protruding portion 222 contacts and covers the LED area 214 of the LED plate 212 once the top plate 208 is lowered 216 onto the bottom plate 210. In the example illustrated in FIG. 2, the bottom-side 222' of the protruding portion 222 has a circular shape, and the LED area 214 of the LED plate 212 also has a circular shape. However, one of ordinary skill in the art will appreciate that the protruding portion 222 (or the bottom-side 222' thereof) and/or the LED area 214 may have alternative shapes without deviating from the scope of the present disclosure.

Figure 3A:
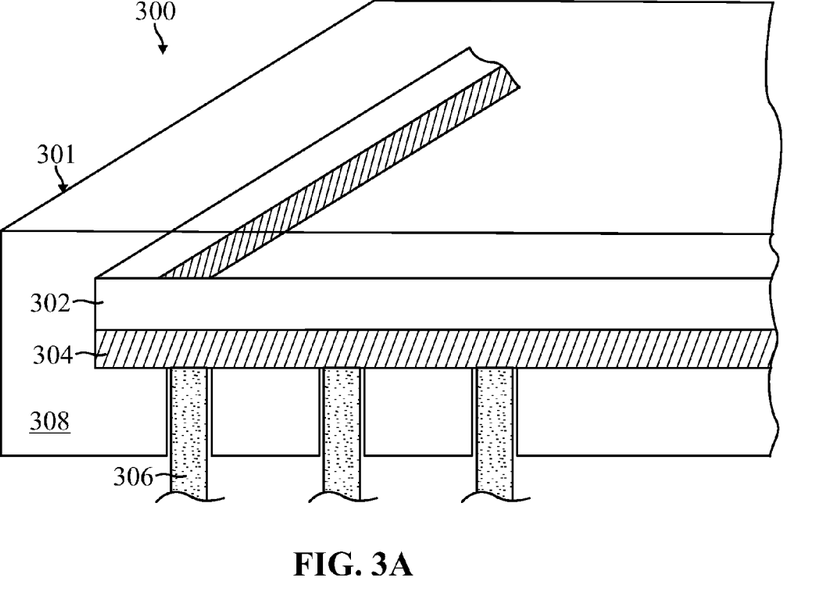
FIG. 3A is a side view illustration of a first exemplary embodiment of an interconnect formed after the molding material is injected by the insert molding machine.

FIG. 3A is a side view illustration 300 of a first exemplary embodiment of an interconnect 301 formed after the semi-solid molding material is injected. The semi-solid molding material may harden to form the molding material 308. The molding material 308 may surround the electrical trace 302 and the electrical insulator 304 except for the portions of the electrical insulator 304 that contact the inserts 306. The electrical insulator 304 is located between the electrical trace 302 and the inserts 306. Eventually, the interconnect 301 is removed from the mold. Because the inserts 306 are part of the bottom plate 110 (see FIG. 1), removal of the interconnect 301 from the mold will also remove inserts 306.

Figure 3B:
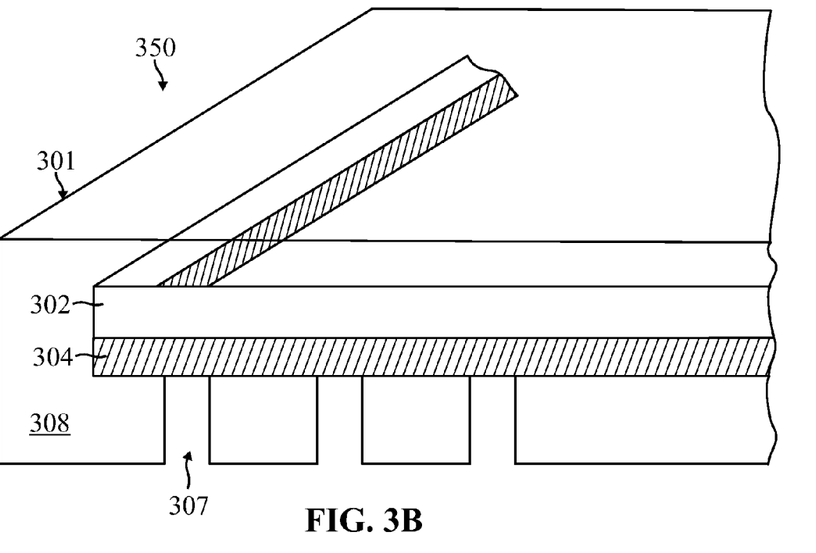
FIG. 3B is a side view illustration of the first exemplary embodiment of the interconnect after inserts of the insert molding machine are removed.

FIG. 3B is a side view illustration 350 of the first exemplary embodiment of the interconnect 301 after the inserts 306 (see FIG. 3A) are removed. Cavities 307 may be formed upon the removal of the inserts 306 (see FIG. 3A). The electrical insulator 304 may be exposed through the cavities 307. The electrical insulator 304 may be configured to inhibit the electrical trace 302 from conducting current through the cavities 307. Because electrical insulator 304 was provided between the electrical trace 302 and the inserts 306 (see FIG. 3A), removal of the inserts 306 (see FIG. 3A) will not result in an exposed portion of the electrical trace 302 (at least in the area corresponding to the area where the inserts 306 (see FIG. 3A) were previously located).

The electrical insulator 304 prevents corrosion of at least the portions of the electrical trace 302 that would otherwise have been exposed to air. Also, the electrical insulator 304 prevents the electrical trace 302 from short-circuiting at high voltages when otherwise exposed portions of the electrical trace 302 are nearby other metallic surfaces (not shown). Additionally, the electrical insulator 304 obviates any need for a manufacturer or user to 'plug' (e.g., fill-in) the cavities 307 in order to prevent corrosions and/or short-circuiting.

In the first exemplary embodiment of the interconnect 301, the electrical insulator 304 is provided for nearly all of one side of the electrical trace 302. However, one of ordinary skill in the art will appreciate that alternative configurations of the electrical trace 302 and the electrical insulator 304 may be provided without deviating from the scope of the present disclosure, as will be described infra with respect to FIGS. 4A-4B.

Figure 4A:
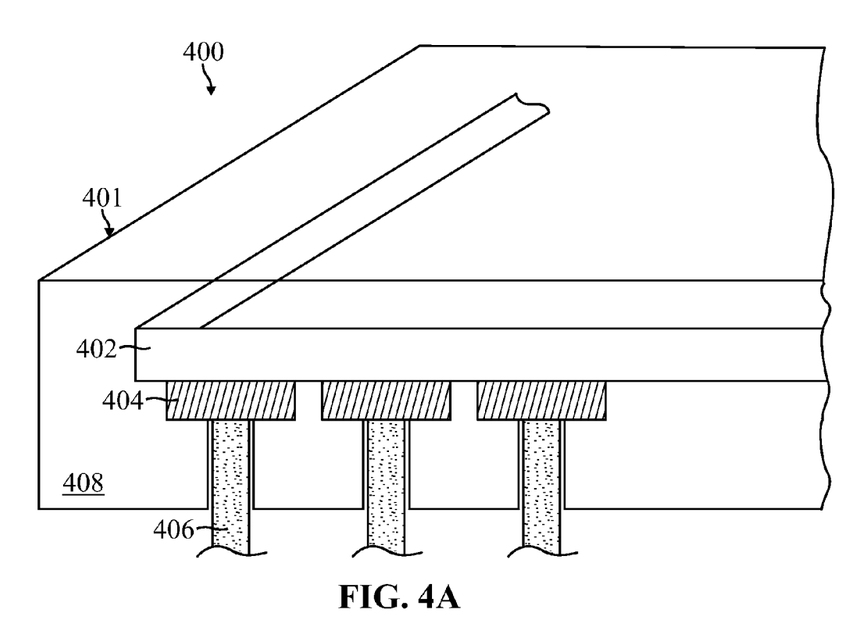
FIG. 4A is a side view illustration of a second exemplary embodiment of an interconnect formed after the molding material is injected by the insert molding machine.
Figure 4B:
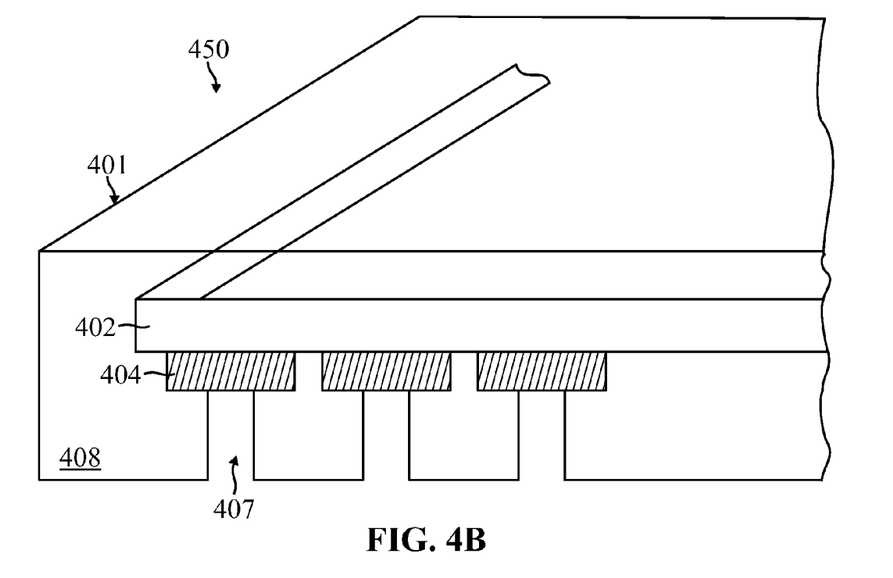
FIG. 4B is a side view illustration of the second exemplary embodiment of the interconnect after inserts of the insert molding machine are removed.

FIG. 4A is a side view illustration 400 of a second exemplary embodiment of an interconnect 401 formed after the semi-solid molding material is injected. FIG. 4B is a side view illustration 450 of the second exemplary embodiment of the interconnect 401 after the inserts 406 (see FIG. 4A) are removed. Common features described supra with reference to FIGS. 3A-3B will not be repeated with reference to FIGS. 4A-4B. In comparison to the first exemplary embodiment of the interconnect 301 (see FIGS. 3A-3B), the electrical insulator 404 of the second exemplary embodiment of the interconnect 401 (see FIGS. 4A-4B) is not provided for nearly all of one side of the electrical trace 402. Accordingly, in the second exemplary embodiment of the interconnect 401, the electrical insulator 404 is provided for portions of the electrical trace 402 that are expected to be supported by (e.g., in contact with) the inserts 406 (see FIG. 4A). As such, no electrical insulator 404 may be provided for portions of the electrical trace 402 that are not expected to be supported by (e.g., in contact with) the inserts 406 (see FIG. 4A).

Nevertheless, cavities 407 (see FIG. 4B) may be formed upon the removal of the inserts 406 (see FIG. 4A). However, because electrical insulator 404 was provided between the electrical trace 402 and the inserts 406 (see FIG. 4A), removal of the inserts 406 (see FIG. 4A) will not result in an exposed portion of the electrical trace 402 (at least in the area corresponding to the area where the inserts 406 (see FIG. 4A) were previously located). As described supra, the electrical insulator 404 prevents corrosion of at least the portions of the electrical trace 402 that would otherwise have been exposed to air. Also, the electrical insulator 404 prevents those portions of the electrical trace 402 from contacting thermal grease or epoxy located nearby those portions of the electrical trace 402. Additionally, the electrical insulator 404 prevents the electrical trace 402 from short-circuiting at high voltages when otherwise exposed portions of the electrical trace 402 are nearby other metallic surfaces (not shown). Further, the electrical insulator 404 obviates any need for a manufacturer or user to 'plug' (e.g., fill-in) the cavities 407 in order to prevent corrosions and/or short-circuiting.

Figure 5:
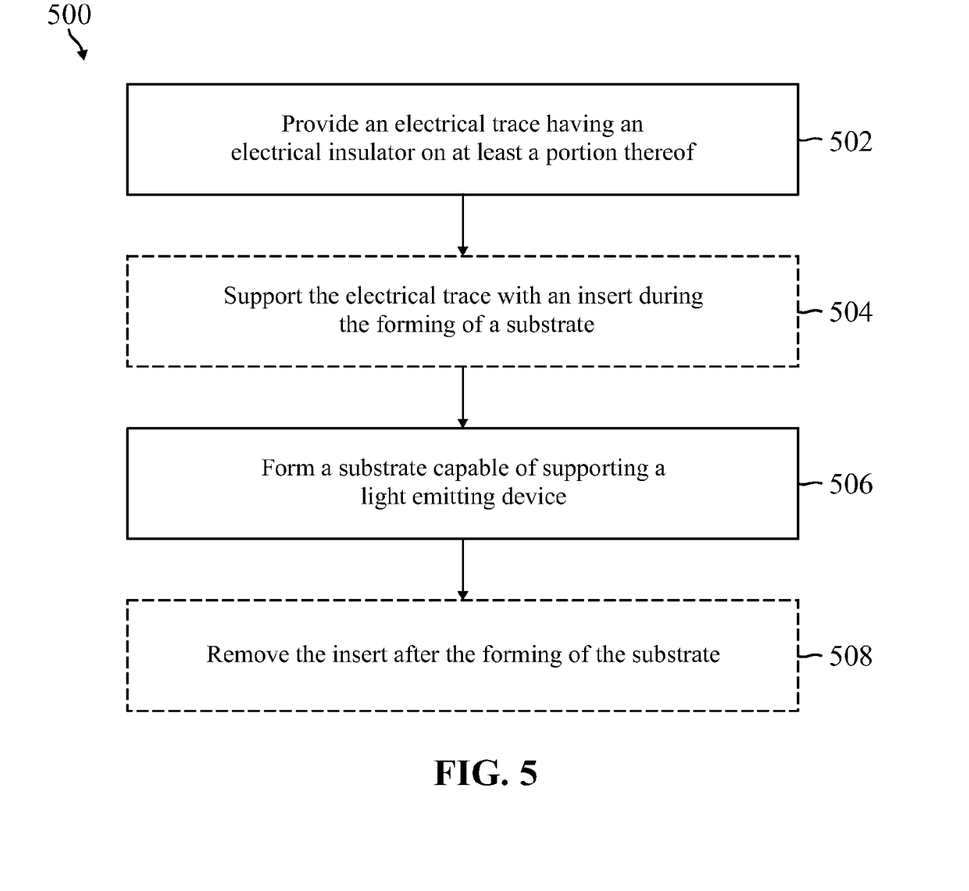
FIG. 5 is a flowchart illustrating exemplary methods for manufacturing an interconnect.

FIG. 5 is a flowchart 500 illustrating exemplary methods of manufacturing an interconnect. The method may be performed by an apparatus, such as an insert molding machine. At block 502, the apparatus may provide an electrical trace having an electrical insulator on at least a portion thereof. For example, referring back to FIG. 2, the apparatus may provide the electrical trace 202 having the electrical insulator 204 on at least a portion thereof.

In some configurations, at block 504, the apparatus may support the electrical trace with an insert during the forming of molding material. For example, referring back to FIG. 2, the apparatus may support the electrical trace 202 with inserts 206 as the molding material (e.g., molding material 308 in FIG. 3A) is injected by the injection component 218 into the cavity formed when the top plate 208 is lowered 216 onto the bottom plate 210.

At block 506, the apparatus may form molding material capable of supporting a light-emitting device. The electrical trace may be configured to electrically couple the light-emitting device to a power source. For example, referring back to FIGS. 1A-1B, the apparatus may form molding material 108. The molding material 108 supports the LED plate 112 onto which the light-emitting device 114 is provided. Accordingly, the molding material 108 supports the light-emitting device 114. The electrical trace 102 may be configured to electrically couple the light-emitting device 114 to a power source (not shown).

In some configurations, at block 508, the apparatus may remove the insert from the electrical trace after the forming of the molding material. For example, referring back to FIGS. 3A-3B, the apparatus may remove the inserts 306 after the molding material 308 has been formed. Cavities 307 may be formed upon the removal of the inserts 306.

The order and/or hierarchy of the blocks in the processes disclosed in FIG. 5 are merely illustrations of various examples. Based upon design preferences, the order and/or hierarchies of blocks in the processes may be re-arranged, amended, and/or modified. The accompanying method claims include various limitations related to a process, but the recited limitations are not meant to be limited in any way by the specific order or hierarchy depicted in FIG. 5 unless expressly stated in the claims.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

Thus, the claims are not intended to be limited to the various aspects of this disclosure, but are to be accorded the full scope consistent with the language of the claims. All structural and functional equivalents to the various components of the exemplary embodiments described throughout this disclosure that are known to those of ordinary skill in the art are expressly incorporated herein by reference and are intended to be encompassed by the claims.

What is claimed is:

1. A method of manufacturing an interconnect, comprising:
    providing an electrical trace;
    providing an electrical insulator;
    forming molding material capable of supporting a light-emitting device, the molding material being formed with the electrical trace configured to electrically couple the light-emitting device to a power source;
    supporting the electrical trace with an insert during the forming of the molding material; and
    removing the insert after the forming of the molding material, wherein the forming of the molding material with the electrical trace supported by the insert results in one or more cavities in the molding material when the insert is removed, and wherein the electrical insulator is positioned between the electrical trace and the one more cavities.

2. The method of claim 1, wherein the forming of the molding material comprises embedding the electrical trace inside of the molding material.

3. The method of claim 1, wherein the forming of the molding material comprises insert molding the molding material with the electrical trace.

4. The method of claim 1, wherein the providing of the electrical trace comprises placing the electrical trace into a cavity of an insert molding machine, and wherein the forming of the molding material comprises injecting material into the cavity.

5. The method of claim 1, further comprising forming the electrical insulator on the at least a portion of the electrical trace.

6. The method of claim 1, wherein the electrical trace is supported during the forming of the molding material such that the electrical insulator is exposed through the one or more cavities when the insert is removed.

* * * * *